United States Patent [19]

Sari

[11] Patent Number: 4,672,914
[45] Date of Patent: Jun. 16, 1987

[54] SYSTEM FOR THE TREATMENT OF EDGE SUPPORTED SUBSTRATES

[75] Inventor: Eric T. Sari, Plymouth, Minn.

[73] Assignee: ETS Energy Technology Systems Inc., Plymouth, Minn.

[21] Appl. No.: 840,311

[22] Filed: Mar. 14, 1986

Related U.S. Application Data

[63] Continuation-in-part of Ser. No. 775,636, Sep. 13, 1985, now Defensive Publication No. 4,643,129.

[51] Int. Cl.$^4$ ............................................. B05B 5/00
[52] U.S. Cl. ................................. 118/641; 118/324; 118/500; 118/642; 198/817
[58] Field of Search ............... 118/324, 500, 641, 642; 198/817

[56] References Cited

U.S. PATENT DOCUMENTS 4,418,815 12/1983 Anderson et al. .......... 198/803.15 X

Primary Examiner—Bernard D. Pianalto
Attorney, Agent, or Firm—Burd, Bartz & Gutenkauf

[57] ABSTRACT

A system for the thermal and/or liquid treatment of edge supported substrates, such as printed electronic circuit boards and hybrid circuits. The system includes an elongated tunnel treating chamber. The system includes a conveyor system comprised of a pair of lubricant-free tape conveyors supported for movement through the treating chamber on a pair of elongated tracks. The lubricant-free tape conveyor is comprised of a closed loop flexible steel tape provided with a plurality of longitudinally spaced apart vertical tabs throughout its length. The tabs are in longitudinal alignment, spaced inwardly from the edges of the tape and provide lateral support for substrates suspended between a pair of conveyor tapes.

14 Claims, 7 Drawing Figures

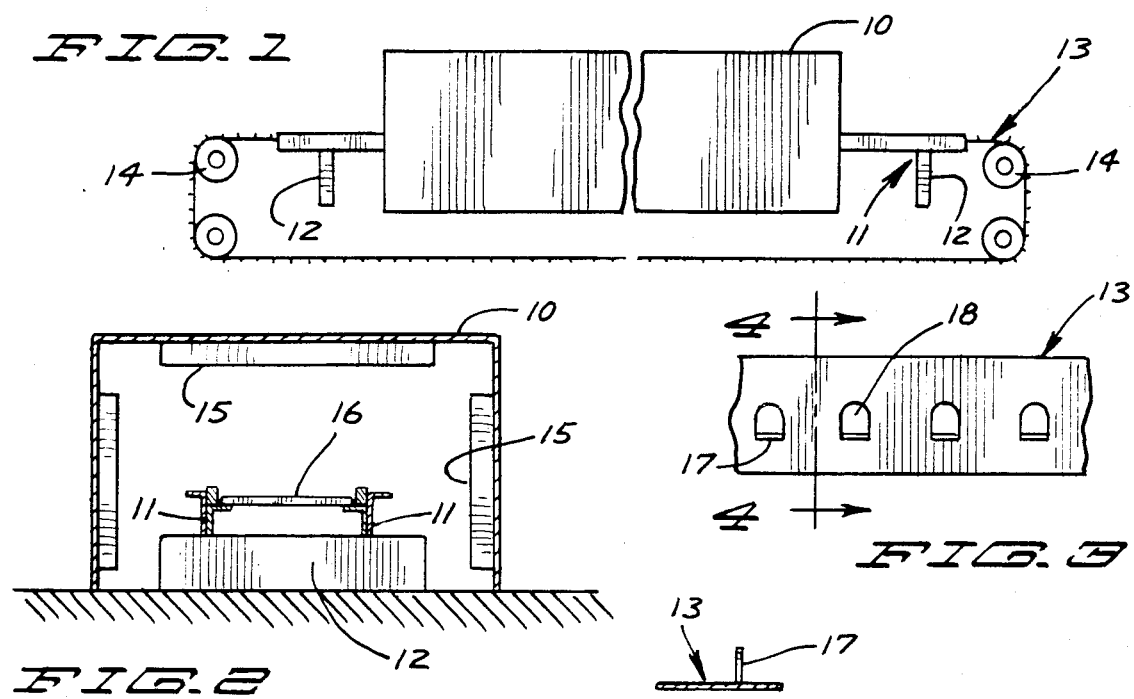
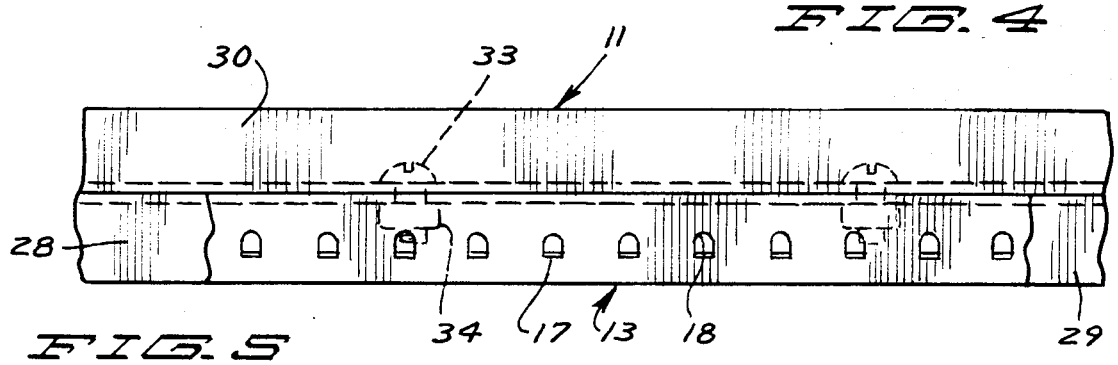
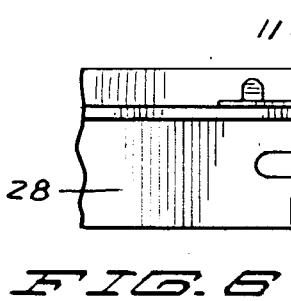
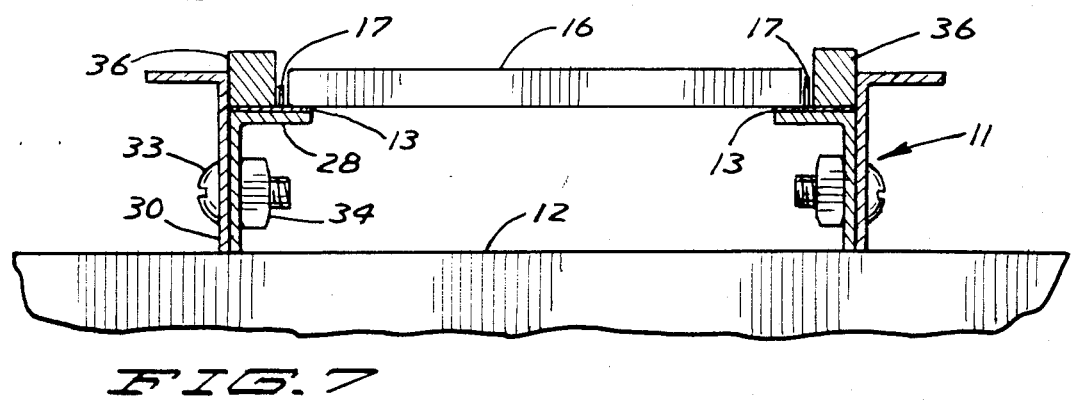

SYSTEM FOR THE TREATMENT OF EDGE SUPPORTED SUBSTRATES

This application is a continuation-in-part of application Ser. No. 775,636, filed Sept. 13, 1985 now U.S. Pat. No. 4,643,129.

FIELD OF THE INVENTION

1. Background of the Invention

This invention is directed to a system for the thermal and/or liquid treatment of edge supported substrates, such as printed electronic circuit boards and the like, and especially as applied to surface mount technology. More particularly, the invention is directed to a novel lubricant-free flexible steel tape conveyor having projecting tabs providing lateral support for the circuit boards or hybrid circuits or similar substrates suspended between the tapes by their edges in the course of passage through thermal and/or liquid treatment.

In the manufacture of printed circuit boards or hybrid circuits, it is common practice to subject the boards to successive liquid and thermal treatment steps including solvent degreasing, spray coating, drying, baking, and the like. Such treatments are difficult to carry out on a continuous basis utilizing available conveyor systems since the treatments have a deleterious effect on the conveyor systems, as by removing lubricant, baking and solidifying lubricant, and the like. The present invention is directed toward alleviation of the deficiencies of the prior art.

2. The Prior Art

According to current practice, circuit boards are transported through treating chambers by means of full product width wire mesh conveyor belts or roller-type chain conveyors. The successive hubs of a roller chain are provided with projecting pins. Panels to be treated are supported on those pins between a pair of chains and carried through a treating chamber. Such conveyors tend to fail through loss of lubricant in solvent degreasing treatments, by congealing of the lubricant in heating treatments, and the like.

In my aforesaid copending application Ser. No. 775,636, there is disclosed a system for the thermal and/or liquid treatment of edge supported substrates alleviating the problems of the prior art. The system includes an elongated tunnel treating chamber provided with elements for liquid and/or thermal treatment of substrates carried through the treating chamber. The conveyor system for transporting material through the treating chamber includes a pair of elongated tracks extending through the treating chamber. These tracks are supported by members disposed outside of the treating chamber at the opposite ends of the chamber. A lubricant-free chain conveyor is provided on each track, the conveyors each comprising a plurality of successively interconnected wire links. Each link comprises a generally horizontal member in engagement with the top surface of the track, a pair of spaced apart generally vertical members spaced from the horizontal member and connected thereto, and in engagement with the sides of the track, and an integral substrate-supporting pin extending outwardly from one of the link vertical members, the pins of each conveyor being directed inwardly toward each other to support a substrate between the conveyor chains by the edges of the substrate. The conveyor links are interconnected by the horizontal member of one link engaging the vertical members of the next adjacent link. Means are provided for moving the conveyors along the tracks through the treating chamber.

SUMMARY OF THE INVENTION

The present invention is directed to an alternative and improved system for the thermal and/or liquid treatment of edge supported substrates alleviating the problems of the prior art. The system includes an elongated tunnel treating chamber provided with elements for liquid and/or thermal treatment of substrates carried through the treating chamber. The conveyor system for transporting material through the treating chamber includes a pair of elongated horizontal tracks extending through the treating chamber. These tracks are supported by members disposed outside of the treating chamber at the opposite ends of the chamber. A lubricant-free flexible steel tape conveyor is provided on each track. Each tape is provided with a plurality of longitudinally spaced apart vertical tabs throughout its length. The tabs are in longitudinal alignment, spaced inwardly from the edges of the tape and provide lateral support for substrates suspended between the pair of conveyor tapes. Means are provided for moving the conveyor along the tracks through the treating chamber.

BRIEF DESCRIPTION OF THE DRAWINGS

The invention is described in the accompanying drawings in which corresponding parts are identified by the same numerals and in which:

FIG. 1 is a schematic side elevation of a system according to the present invention comprising a treating chamber, conveyor supporting track and drive;

FIG. 2 is a schematic end elevation thereof;

FIG. 3 is a fragmentary plan view of a segment of conveyor tape;

FIG. 4 is a section on the line 4—4 of FIG. 3 and in the direction of the arrows;

FIG. 5 is a fragmentary top plan view of a segment of tape conveyor and supporting tracks;

FIG. 6 is a side elevation thereof; and

FIG. 7 is an end elevation showing a pair of conveyor tapes and their support tracks supporting a substrate for passage through a treating chamber.

DETAILED DESCRIPTION OF THE PREFERRED EMBODIMENT

Referring now to the drawings, and particularly to FIGS. 1 and 2, there is shown in schematic form a system for treating edge supported substrates in the course of passage through a treating chamber. The system comprises a treating chamber in the form of an open-ended tunnel 10 through which a continuous conveyor passes. A pair of parallel spaced apart horizontal conveyor tracks 11 extend through the entire length of the tunnel chamber 10. The opposite ends of tracks 11 are supported by horizontal members 12 at the opposite ends of the treatment tunnel. A pair of continuous thin flexible conveyor tapes 13 extend through tunnel chamber 10 supported on tracks 11. Conveyor tapes 13 are supported in their passage by sprocket wheels or rollers 14, one of which is driven and provided with cogs or other engaging means to facilitate travel of the conveyor tapes. The inside of the tunnel chamber 10 is provided with thermal and/or liquid treating elements 15 adjacent to the path of the conveyor. These may be, for example, infrared or ultraviolet radiant heating lamps or other heating units, liquid spray heads, or the like. The different treatment elements may be spaced apart within the same long tunnel chamber or in separate chambers, depending upon the requirements of the particular substrate being treated. The substrate 16 is supported by its edges between the conveyor tapes for its passage through the chamber 10.

A preferred form of conveyor tape 13 is shown in FIGS. 3 and 4. The tape is thin, flexible, formed in a closed loop and capable of withstanding high temperature, solvent and other chemical treatment, and the like. Desirably, the tape is between about 0.002 and 0.004 inch, preferably about 0.003 inch. For temperatures below about 500° F., an exemplary material is Full Hard 302 stainless steel. For temperatures above about 500° F., an exemplary material is Condition C 700 stainless steel.

Each tape 13 has a plurality of vertically extending tabs 17, all on the same side of the tape. Tabs 17 are in longitudinal alignment spaced inwardly from the edges of the tape. They are uniformly distributed along the tape and longitudinally spaced apart on about ¼ to ½ inch centers. Preferably, the tabs 17 are formed by punching partial longitudinally spaced holes 18 in the tape and bending the tabs to extend perpendicular to the tape surface. The tapes are subjected to heat conditioning after formation of the tabs.

Referring now to FIGS. 5 through 7, there is shown the preferred form of conveyor and supporting track.

In its passage through a treating chamber, the conveyor 13 is supported on track 11. The track 11 preferably has the two-step structure shown in FIGS. 5, 6 and 7. The elongated track 11 is composed of two sets of shorter vertically disposed elongated slotted angle bars each assembled in end-to-end relation and in overlapping side-by-side relation. Thus, angle bars 28 and 29 are assembled in end-to-end relation and overlap angle bar 30, but the top surfaces of angle bars 28 and 29 are vertically displaced below the top surface of angle bar 30. The top surfaces of angle bars 28 and 29 extend laterally outward beyond the edge of the top surface of angle bar 30 by a distance about equal to the width of tape 13. Thus, tape 13 engages the top surfaces of angle bars 28 and 29. Angle bars 28 and 29 are slotted at 31 and 32, respectively, and secured to angle bar 30 by suitable fastening means, such as bolts 33 and nuts 34. To prevent buckling of the track when used in a thermal treating chamber, to allow for expansion, a small gap 35 is left between the ends of adjacent angle bars. In the passage of substrates 16 through the treating chamber, they are supported by being suspended between the laterally spaced apart conveyor tapes and move with the tapes. Tabs 17 keep the substrates in alignment by providing lateral support.

As shown in FIG. 7, to prevent accidental bending or breaking of tape tabs 17 when the substrates are being loaded into or unloaded from the system, guide and back-up bars 36 are provided at each end of track 11. Guide bars 36 are stationary, horizontal and elongated and mounted with their lower surfaces closely spaced above the upper surfaces of angle bars 28 and 29 by a distance permitting passage of the tape between those surfaces. Each is about 20 inches long. The facing vertical sides of the guide bars provide back-up side support and protection for the moving vertical tabs. Preferably the bars are composed of polytetrafluoroethylene (Teflon).

It is apparent that many modifications and variations of this invention as hereinbefore set forth may be made without departing from the spirit and scope thereof. The specific embodiments described are given by way of example only and the invention is limited only by the terms of the appended claims.

The embodiments of the invention in which an exclusive property or privilege is claimed are defined as follows:

1. A system for the thermal and liquid treatment of edge supported substrates comprising:
   (A) an elongated tunnel treating chamber,
   (B) a pair of elongated tracks extending through said chamber,
   (C) support members for said tracks outside of said chamber at opposite ends thereof,
   (D) a lubricant-free closed loop tape conveyor on each of said tracks, said conveyor having a plurality of longitudinally aligned and longitudinally spaced vertical tabs spaced inwardly from the edges of the tape, said tape being in engagement with the top surface of said tracks, to support a substrate therebetween by its edges, and
   (E) means for moving said conveyors along said tracks.

2. A system according to claim 1 wherein said tunnel treating chamber includes thermal treating elements adjacent the conveyor path.

3. A system according to claim 2 wherein said thermal treating units are heating units.

4. A system according to claim 1 wherein said tunnel treating chamber includes liquid treating elements adjacent the conveyor path.

5. A system according to claim 4 wherein said liquid treating elements are solvent spray heads.

6. A system according to claim 1 wherein said tracks are each composed of one set of a plurality of shorter elongated slotted bars in end-to-end relation secured together in overlapping side-by-side relation with a second set of similar bars, with a small gap between the ends of adjacent bars.

7. A system according to claim 1 wherein the tabs of said conveyor tape are each comprised of a partially punched hole bent to extend perpendicular to the surface of the tape.

8. A system according to claim 7 wherein said conveyor tape is composed of stainless steel.

9. A system according to claim 1 wherein an elongated guide and back-up bar is provided on each of said tracks ahead of and downstream from the treating chamber,
   (A) said bar being spaced from the track surface to permit the tape conveyor to pass between the top of the track surface and the bottom of the bar, and
   (B) said bar overlies only the width of the tape conveyor between its outer edge and said vertical tabs.

10. A system according to claim 9 wherein said bar is composed of polytetrafluoroethylene.

11. A lubricant-free conveyor for carrying substrates through a treatment chamber, said conveyor comprising:
   (A) a pair of parallel spaced apart elongated thin flexible closed loop tapes each having a single row composed of a plurality of longitudinally aligned and longitudinally spaced uniformly distributed identical vertical tabs pg,12 spaced inwardly from the edges of the tape, and (B) a pair of elongated parallel spaced apart generally horizontal tape supporting tracks underlying said parallel tapes, said tapes engaging the top surfaces of the tracks, the surfaces of the tapes between their inner edges and said vertical tabs being adapted to support a substrate by suspension therebetween by its edges.

12. A lubricant-free conveyor according to claim 11 wherein said elongated tracks are each comprised of one set of a plurality of shorter elongated slotted bars in end-to-end relation secured together in overlapping side-by-side relation with a second set of similar bars, with a small gap between the ends of adjacent bars.

13. A lubricant-free conveyor according to claim 11 wherein an elongated guide and back-up bar is provided on each of said tracks,
   (A) said bar being spaced from the track surface to permit the tape conveyor to pass between the top of the track surface and the bottom of the bar, and
   (B) said bar overlying only the width of the tape conveyor between its outer edge and said vertical tabs.

14. A lubricant-free conveyor according to claim 13 wherein said conveyor tape is composed of stainless steel and said bar is composed of polytetrafluoroethylene.

* * * * *

UNITED STATES PATENT AND TRADEMARK OFFICE
CERTIFICATE OF CORRECTION

PATENT NO. :   4,672,914

DATED      :   June 16, 1987

INVENTOR(S) :  Eric T. Sari

It is certified that error appears in the above-identified patent and that said Letters Patent is hereby corrected as shown below:

On the title page, in the heading, line "[63]", "Defensive Publication" should read --Patent--.

Column 4, line 67, "pg,12" should be omitted.

Signed and Sealed this

Twenty-second Day of November, 1988

Attest:

DONALD J. QUIGG

*Attesting Officer*        *Commissioner of Patents and Trademarks*